United States Patent [19]

Barabolak

[11] Patent Number: 5,373,101
[45] Date of Patent: Dec. 13, 1994

[54] ELECTRICAL INTERCONNECT APPARATUS

[75] Inventor: Mark A. Barabolak, Elmhurst, Ill.

[73] Assignee: Motorola, Inc., Schaumburg, Ill.

[21] Appl. No.: 64,613

[22] Filed: May 19, 1993

Related U.S. Application Data

[63] Continuation-in-part of Ser. No. 695,080, May 3, 1991, Pat. No. 5,239,127.

[51] Int. Cl.$^5$ .............................................. H05K 9/00
[52] U.S. Cl. ........................... 174/35 R; 174/35 GC; 361/816
[58] Field of Search .......... 174/35 R, 35 GC, 35 MS; 219/10.55 R, 10.55 D; 361/796, 799, 800, 816, 818, 752

[56] References Cited

U.S. PATENT DOCUMENTS

| | | | |
|---|---|---|---|
| 4,761,516 | 8/1988 | Reichert | 174/35 GC |
| 4,831,498 | 5/1989 | Baba | 361/424 |
| 4,890,199 | 12/1989 | Beutler | 361/424 |
| 5,043,528 | 8/1991 | Mohr | 174/35 GC |
| 5,053,924 | 10/1991 | Kurgan | 361/424 |
| 5,053,926 | 10/1991 | Dickie | 361/424 |
| 5,124,889 | 6/1992 | Humbert et al. | 361/424 |
| 5,239,127 | 8/1993 | Swikle et al. | 174/35 R |

*Primary Examiner*—Leo P. Picard
*Assistant Examiner*—Christopher Horgan
*Attorney, Agent, or Firm*—Kevin D. Kaschke

[57] ABSTRACT

An electrical interconnect apparatus (503) comprises a housing (500), an electrically conductive contact (209) and an electrically conductive spring member (211). The housing (500) has an electrically insulative outer layer (602) and an electrically conductive inner layer (603). The electrically conductive contact (209) includes a protrusion (311) having an edge (317) and partially displaced from a plane (307) of the contact (209) at an acute angle. The electrically conductive spring member (211), coupled to the electrically conductive contact (209), biases the electrically conductive contact (209) towards the housing (500) in a manner such that the edge (317) of the protrusion (311) extends through the electrically insulative outer layer (602) and into the electrically conductive inner layer (603) to form an electrical interconnection between the electrically conductive contact (209) and the electrically conductive inner layer (603).

10 Claims, 3 Drawing Sheets

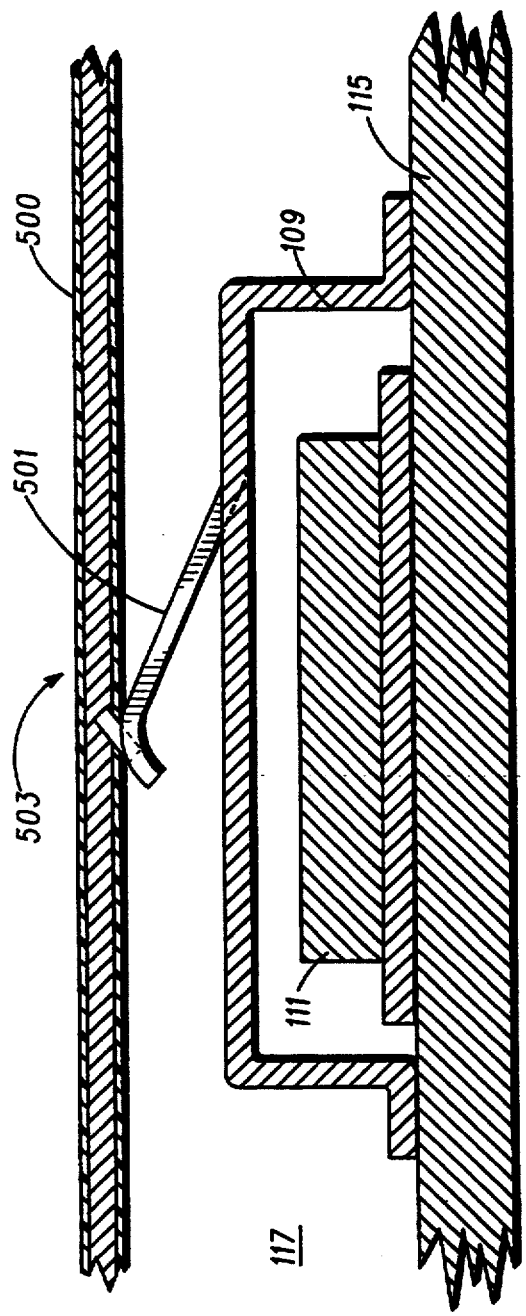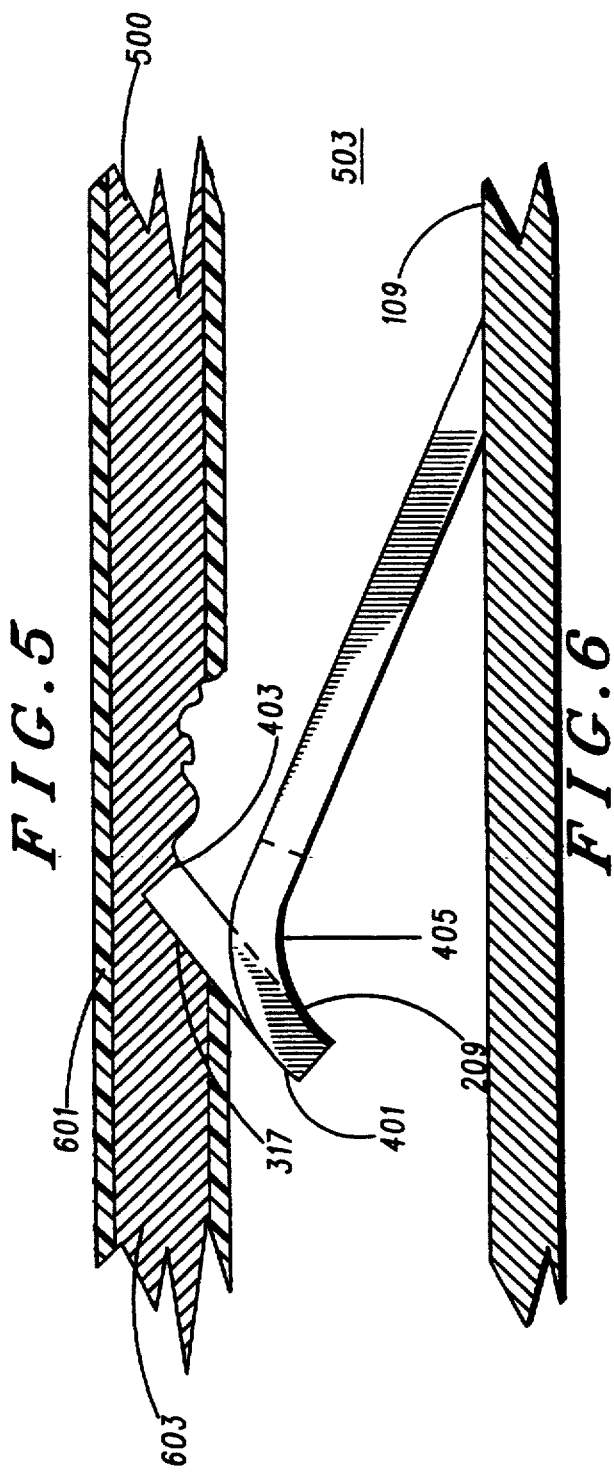

2

ELECTRICAL INTERCONNECT APPARATUS

RELATED APPLICATION

The present invention is a continuation in part of Ser. No. 07/695,080, now U.S. Pat. No. 5,239,127, filed on May 3, 1991 and assigned to the assignee of the present invention.

FIELD OF THE INVENTION

The present invention relates generally to electrical interconnections and more particularly to an electrical interconnect apparatus for grounding an electromagnetic shield.

BACKGROUND OF THE INVENTION

Modern day radio communication devices are being continually designed and manufactured with greater reliability yet lower manufacturing costs and simplified assembly. With a continuing demand for better capabilities and additional service features the circuitry has become ever increasingly complex and more dense when arranged on associated circuit boards or the like.

The expected increase in operating efficiencies and new or additional service features have been, for the most part, achieved on a reasonably broad front. However, this does not mean that operating parameters or requirements have simply been ignored or somehow has, or can be, designed away.

In RF circuitry, for example, shielding is still a necessity which requires appropriate connection of such shield and adequate circuit ground. A shield of an appropriate conductive material must somehow be reliably connected to a conductive ground circuit on the printed circuit board yet be readily removable for servicing of the RF circuitry, being so shielded, if the need so arises.

One approach taken to a grounding an RF shield is to simply solder a part of the shield to a conductive circuit. Although this type of connection is reliable, it is not easily replaceable.

Another approach taken to a grounding an RF shield is to form a spring member, extending from the RF shield, and bias an end of the spring member against a surface of a conductive circuit. Although, this type of connection is easily replaceable, it is not as reliable as the solder approach.

Consequently, there is a need for an electrical interconnect apparatus for an RF shield that is reliable and yet easily replaceable.

BRIEF DESCRIPTION OF THE DRAWINGS

A detailed description of the preferred embodiments of the present invention will be better understood when read with reference to the accompanying drawings in which:

FIGS. 3-1 and 3-2 illustrate a top and bottom magnified perspective view of a free end of the spring member of FIG. 2, in accordance with the present invention;

FIG. 5 illustrates a cross-sectional view of the RF shield assembly of FIG. 1, including another spring member, in accordance with an alternate embodiment of the present invention; and FIG. 6 illustrates a partial side elevation view of an electrical interconnect apparatus including, the other spring member of FIG. 5, biasing an end of the spring member towards a housing having a conductive inner layer, in accordance with the alternate embodiment the present invention.

DETAILED DESCRIPTION OF THE PREFERRED EMBODIMENT

Generally, an electrical interconnect apparatus comprises a housing, an electrically conductive contact and an electrically conductive spring member. The housing has an electrically insulative outer layer and an electrically conductive inner layer. The electrically conductive contact includes a protrusion having an edge and partially displaced from a plane of the contact at an acute angle. The electrically conductive spring member, coupled to the electrically conductive contact, biases the electrically conductive contact towards the housing in a manner such that the edge of the protrusion extends through the electrically insulative outer layer and into the electrically conductive inner layer to form an electrical interconnection between the electrically conductive contact and the electrically conductive inner layer The detailed description of the preferred embodiments of the present invention can be better understood when read with reference to the accompanying drawings illustrated in FIGS. 1–6.

Figure 1:
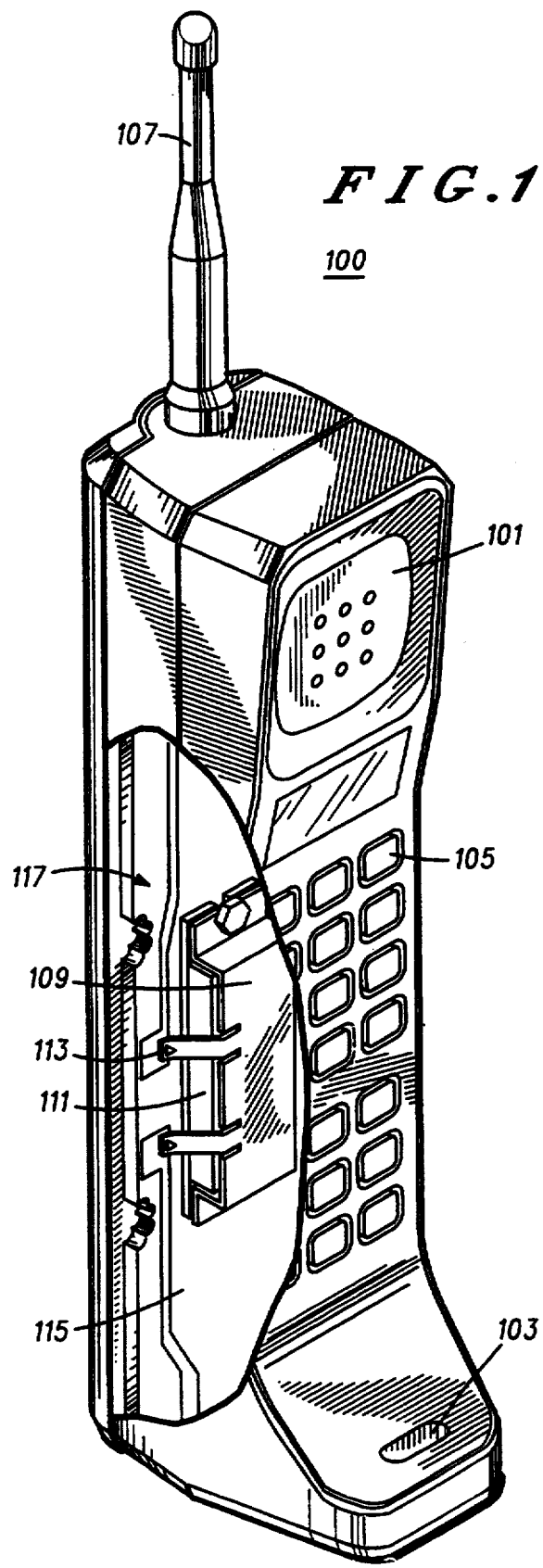
FIG. 1 illustrates a perspective cut-away view of a radio communication device exposing an RF shield assembly, including an RF shield, in accordance with the present invention.

Referring now to the drawings, there is shown in FIG. 1, a portable radio telephone unit 100 adapted for use in a radiotelephone system. A user of the portable unit may listen via ear piece 101 and may speak into a microphone 103. The keypad 105 consists of a plurality of buttons numbered 1 through 0, # and *, in a familiar telephone arrangement. The keypad 105 may also have additional functional buttons such as volume control and other buttons associated with telephone number recall. An antenna 107 enables wireless communication between the portable unit 100 and a remote base site.

A cut-away view of FIG. 1 shows an RF shield 109 effecting RF shielding for an RF emitting device 111 advantageously utilizing an effective ground connection 113 between the RF shield 109 and a printed circuit board 115.

Figures 1, 3:
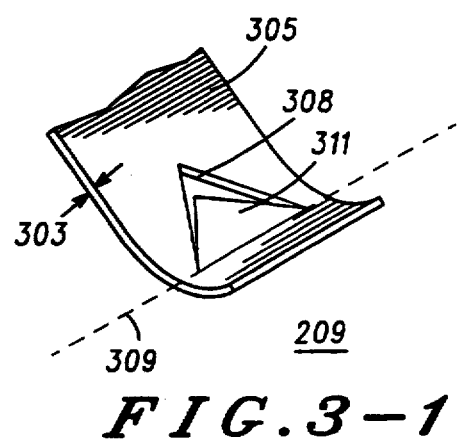
Figures 2, 3:
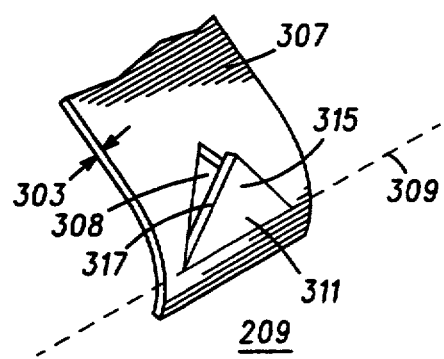
Figure 2:
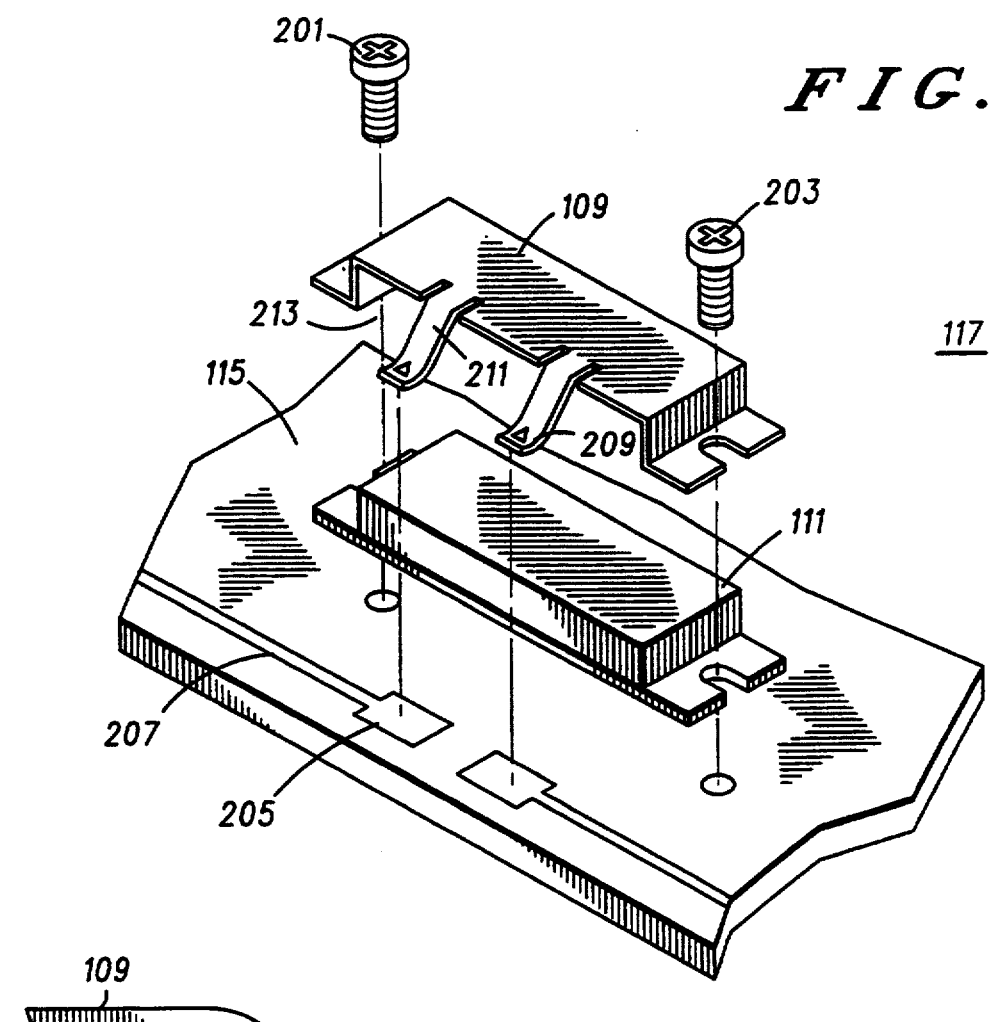
FIG. 2 is an exploded perspective view of the RF shield assembly of FIG. 1, including a spring member, in accordance with the present invention.

The cut-away view of FIG. 1 is shown in an exploded perspective detail in FIG. 2. The printed circuit board 115 is fabricated of a non-conductive material such as fiberglass, which is plated with various conductive circuits and connection pads as well as associated component elements mounted thereon, which when incorporation, provide the desired transmitting/receiving functions for the controlling users/operator.

The RF emitting device 111, such as an RF power amplifier, is intended for containment in the RF shield 109. Screws 201 and 203, threaded into a grounding plate beneath the printed circuit board 115, secure the RF shield 109 and the RF emitting device 111 to the printed circuit board 115.

A significant aspect of the present invention is the provision for providing a renewable and reliable ground connection between the RF shield 109 and the printed circuit board 115. The advantage of this ground connection over the aforementioned conventional grounding approaches is that the solder is not heated and yet a reliable connection is realized. The spring member 211 has a free end 209 which resiliently contacts a respective conductive circuit 207 having solder 205 partially disposed thereon. The RF shield 109 is assembled to the printed circuit board 115 at room temperature. The conductive circuit 207 is connected to and effectively maintained at an electrical ground potential coupled to the chassis of the radiotelephone.

It is important to note open side 213 on the side of the RF shield 109 between the screwed down ends of the RF shield. In providing RF shielding in applications of this sort, careful and effective grounding is required to prevent any substantial RF leakage currents from escaping the interior of the RF shield 109 by way of by-passing an ineffective ground connection and thereby disrupt or at least degrades substantially communications quality and circuit operation. A plurality of spring members may be disposed along the open side 213 of the RF shield 109 thereby containing substantial RF leakage currents. The open side 213, in this case, provides for a plurality of spring members wherein each spring member has an effective ground contact to the printed circuit board and ensures such RF leakage currents will be adequately contained and quality operation of the radiotelephone thereby maintained. Such effective shielding is provided and maintained all without the need of heated soldering.

Alternatively, the RF shield may be used to shield a circuit or component from a remote RF emitting device as well as contain RF emissions from an RF emitting device.

Referring now to FIGS. 3-1 and 3-2 there is shown in magnified perspective view of both sides of the free end 209 of the spring member 211. The free end of the spring member has a predetermined thickness 303 disposed between a first top surface 305 and a second bottom surface 307. The top surface 305 is essentially parallel and opposite to the bottom surface 307. A fold line 309, essentially perpendicular to the length of the spring member. The free end 209 has a cut 308 extending from the top surface 305 through to the bottom surface 307 and intersects the fold line 309 in at least two places. The cut 308 is disposed between the fold line 309 and an end of the spring member attached to the RF shield. In the preferred embodiment the perimeter formed by the cut 308 and the fold line yields a triangular shaped portion 311. The bottom surface of the triangular portion 315 is angularly displaced from the bottom surface of the free end 209 about the fold line 309. The angular displacement of the triangular portion 311 exposes an edge 317 of the triangular portion 311 formed by the intersection of the predetermined thickness of the free end 303 and the bottom surface of the triangular portion 315.

The preferred embodiment of the present invention utilizes a cut 308 such that a triangular portion is formed and a pointed edge 317 is created. The present invention is not limited to such a configuration but to any configuration resulting in an edge exposed on the bottom of the free end 209 directed towards the RF shield.

An extension of the preferred embodiment may also include forming a plurality of the edges 317 on the bottom surface of the free end 307. Thus, a plurality of ground connections may be realized thereby increasing the likelihood of a reliable ground connection under a wider variety of manufacturing or design circumstances.

Figure 4:
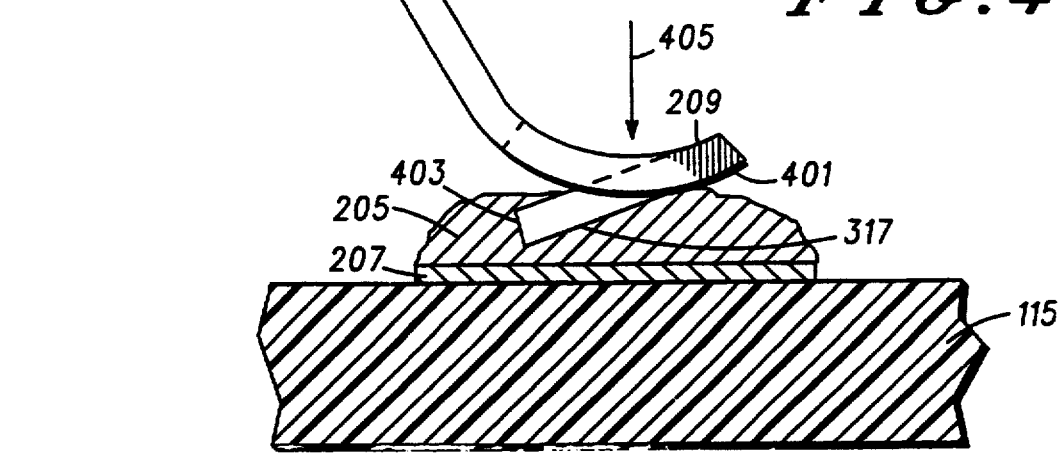
FIG. 4 illustrates a partial side elevation view of the spring member biasing an edge of the free end into solder disposed on a conductive ground circuit, in accordance with the present invention.

FIG. 4 shows the edge of the triangular portion 317 advantageously utilized to form a unique and reliable ground connection. FIG. 4 shows a side elevation view of the spring member 211 forcing its free end 209 into the printed circuit board 115 such that the edge of the triangular portion 317 displaces solder 205 on the conductive circuit 207. As the RF shield 109 is screwed into place as shown in FIG. 2, the spring member 211 flexes due to its interference with the printed circuit board 215. When flexed, the spring member 211 creates a normal force 405 driving the free end 209 into the solder 205. A curved portion of the free end 401 glides along the solder 205 until the spring member 211 is substantially flexed to allow the edge 317 to "plow" forward into the solder. The "plowing" forward of the edge 317 into the solder 205 creates an effective and reliable ground connection. An additional advantage of this "plowing" feature is that if the RF shield 109 should loosen somewhat from its fixed position, a forward edge 403 created by a point of the triangular portion "plows" into the solder 205 in a reverse direction reestablishing the ground connection.

In the preferred embodiment of the present invention a malleable conductive medium comprises conventional tin lead solder at least partially disposed on the conductive circuit. Other embodiments may include other malleable conductive mediums such as conductive carbon ink or gold. The spirit of the invention comprises driving the edge formed in the free end of the spring member into a formidable medium which is displaced by the force exerted on the edge. The junction of the edge and the displaced conductive medium forms a reliable electrical connection.

The preferred embodiment of the present invention is not limited in scope to only providing a ground connection for the RF shield. The present invention provides an electrical connection between an electrical device and a conductive circuit having a malleable conductive medium disposed thereon. Such applications may include providing an electrical connection between a battery contact external to a housing and a conductive circuit on a printed circuit board located within the housing. Another application may include coupling electrical signals from a transducer to a conductive circuit on a printed circuit board. The advantage of this inventive electrical connection eliminates hand soldering the connection and improves reliability over the aforementioned dimple connection while eliminating the need for a wired connection from an electrical device and a printed circuit board.

FIG. 5 illustrates a cross-sectional view of the RF shield assembly 109 of FIG. 1, including another spring member 501, in accordance with an alternate embodiment of the present invention. Generally, the RF shield assembly 109 includes a housing 500, an electromagnetic shield 109, an electrically conductive contact 209 and an electrically conductive spring member 211. At least a portion of a housing 500 has at least an electrically insulative outer layer 601, 602 and an electrically conductive inner layer 603. The electromagnetic shield 109, at least partially covers the electrical circuitry, to form an electrically conductive, electromagnetic wave-absorbing material for absorbing electromagnetic energy radiated by or towards the electronic circuitry. The electrically conductive contact 209 includes a protrusion 311 having an edge 317 and partially displaced from a plane 307 of the contact at an acute angle. The electrically conductive spring member 211, coupling the electrically conductive contact 209 and the electromagnetic shield 109, biases the electrically conductive contact 209 towards the housing 500 in a manner such that the edge of the protrusion 311 extends through the electrically insulative outer layer 602 and into the electrically conductive inner layer 603 to form an electrical interconnection between the electrically conductive inner layer 603 of the housing 500 and the electromagnetic shield 109.

In the radiotelephone 100, including radio frequency circuitry 111, the electrical interconnection between the electrically conductive inner layer 603 of the housing 500 and the electromagnetic shield 109 permits the radio frequency circuitry to be advantageously shielded by at least partially by at least one of the electrically conductive inner layer 603 of the housing and the electromagnetic shield 109.

FIG. 6 illustrates a partial side elevation view of an electrical interconnect apparatus 115 including, the other spring member 501 of FIG. 5, biasing an end of the spring member 501 towards the housing 500 having the conductive inner layer 603, in accordance with the alternate embodiment the present invention. The electrical interconnect apparatus 503 comprises a housing 500, an electrically conductive contact 209 and an electrically conductive spring member 211. The housing 500 has an electrically insulative outer layer 602 and an electrically conductive inner layer 603. The electrically conductive contact 209 includes a protrusion 311 having an edge 317 and partially displaced from a plane 307 of the contact 209 at an acute angle. The electrically conductive spring member 211, coupled to the electrically conductive contact 209, biases the electrically conductive contact 209 towards the housing 500 in a manner such that the edge 317 of the protrusion extends through the electrically insulative outer layer 602 and into the electrically conductive inner layer 603 to form an electrical interconnection between the electrically conductive contact 209 and the electrically conductive inner layer 603.

In the radiotelephone 100, including radio frequency circuitry 111, the electrical interconnection between the electrically grounded contact 209 and the electrically conductive inner layer 603 allows the electrically conductive inner layer 603 to advantageously provide an electromagnetic shielding surface for the radio frequency circuitry.

The housing 500, including an electrically insulative outer layer 602 and an electrically conductive inner layer 603. Individually, the housing 500 formed in this manner is well known in the art and no further discussion will be presented except to facilitate the understanding of the present invention. In the preferred embodiment of the present invention, the housing 500 is formed of an injection moldable thermoplastic composite material commercially available from plastic material suppliers such as LNP Engineering Plastics Inc. (EMI-X Grades.) or Toshiba Chemical Corp. (EMI-CLEAR Grades). The electrically conductive inner layer 603 is formed of a matrix of the base resin and a conductive filler, i.e. stainless steel, copper, carbon, or other electrically conductive fibers. The electrically insulative outer layer 603 is formed by processing the injection moldable material so as to produce a "resin rich", insulative surface skin on the housing free of conductive filler, by painting, for example, or otherwise coating the part with a non-conductive material.

The alternate embodiment of the present invention provides an electrical interconnect apparatus between an electrically conductive contact and an electrically conductive inner layer of a housing to overcome the disadvantages of the prior art. This is accomplished by using the contact 209 of the shield 109 to displace the insulative outer layer 603 as part of the shield 109 thus advantageously eliminating the need for additional parts or fasteners. The contact 209 provides a self-renewable ground connection for ease of repair or rework of the radio frequency circuitry 111. The contact's 209 biasing force 405 and exposed edge 317 create a contact system that is relatively immune to vibration and permanent deformations of the contacting material.

What is claimed is:

1. An electrical interconnect apparatus comprising:
   at least a portion of a housing having at least an electrically insulative outer layer and an electrically conductive inner layer;
   an electrically conductive contact including a protrusion having an edge and partially displaced from a plane of the contact at an acute angle; and
   an electrically conductive spring member, coupled to the electrically conductive contact, for biasing the electrically conductive contact towards the housing in a manner such that the edge of the protrusion extends through the electrically insulative outer layer and into the electrically conductive inner layer to form an electrical interconnection between the electrically conductive contact and the electrically conductive inner layer.

2. An electrical interconnect apparatus according to claim 1 wherein the protrusion has a triangular shape.

3. An electrical interconnect apparatus according to claim 1 wherein the electrically conductive spring member further comprises an elongated, planar arm integrally formed the electrically conductive contact.

4. An electrical interconnect apparatus according to claim 1 wherein the electrically-conductive inner layer further comprises a shielding surface adapted to absorb signals of radio frequencies.

5. A radiotelephone comprising:
   radio frequency circuitry;
   at least a portion of a housing having at least an electrically insulative outer layer and an electrically conductive inner layer at least partially covering the radio frequency circuitry;
   an electrically grounded contact including a protrusion having an edge and partially displaced from a plane of the contact at an acute angle; and
   an electrically conductive spring member, coupled to the electrically conductive contact, for biasing the electrically grounded contact towards the housing in a manner such that the edge of the protrusion extends through the electrically insulative outer layer and into the electrically conductive inner layer to form an electrical interconnection between the electrically grounded contact and the electrically conductive inner layer whereby the electrically conductive inner layer provides an electromagnetic shielding surface for the radio frequency circuitry.

6. An electromagnetic shielding apparatus for shielding electrical circuitry comprising:

at least a portion of a housing having at least an electrically insulative outer layer and an electrically conductive inner layer;

an electromagnetic shield, at least partially covering the electrical circuitry, formed of an electrically conductive, electromagnetic wave-absorbing material for absorbing electromagnetic energy radiated by or towards the electronic circuitry;

an electrically conductive contact including a protrusion having an edge and partially displaced from a plane of the contact at an acute angle; and an electrically conductive spring member, coupling the electrically conductive contact and the electromagnetic shield, for biasing the electrically conductive contact towards the housing in a manner such that the edge of the protrusion extends through the electrically insulative outer layer and into the electrically conductive inner layer to form an electrical interconnection between the electrically conductive inner layer of the housing and the electromagnetic shield.

7. An electromagnetic shielding apparatus according to claim 6 wherein the protrusion has a triangular shape.

8. An electromagnetic shielding apparatus according to claim 6 wherein the electrically conductive spring member further comprises an elongated, planar arm integrally formed the electrically conductive contact and the electromagnetic shield.

9. An electromagnetic shielding apparatus according to claim 6 wherein the electrically-conductive inner layer and the electromagnetic shield further comprises a shielding surface adapted to absorb signals of radio frequencies.

10. A radiotelephone comprising:

radio frequency circuitry;

at least a portion of a housing having at least an electrically insulative outer layer and an electrically conductive inner layer at least partially covering the radio frequency circuitry;

an electromagnetic shield, at least partially covering the radio frequency circuitry, formed of an electrically conductive, electromagnetic wave-absorbing material for absorbing electromagnetic energy radiated by or towards the electronic circuitry;

an electrically conductive contact including a protrusion having an edge and partially displaced from a plane of the contact at an acute angle; and an electrically conductive spring member, coupling the electrically conductive contact and the electromagnetic shield, for biasing the electrically conductive contact towards the housing in a manner such that the edge of the protrusion extends through the electrically insulative outer layer and into the electrically conductive inner layer to form an electrical interconnection between the electrically conductive inner layer of the housing and the electromagnetic shield whereby the radio frequency circuitry is shielded at least partially by at least one of the electrically conductive inner layer of the housing and the electromagnetic shield.

* * * * *